US007944284B2

(12) United States Patent
Blair

(10) Patent No.: US 7,944,284 B2
(45) Date of Patent: May 17, 2011

(54) SYSTEM AND CIRCUIT FOR A VIRTUAL POWER GRID

(75) Inventor: Gerard M Blair, Bath, PA (US)

(73) Assignee: LSI Corporation, Milpitas, CA (US)

( * ) Notice: Subject to any disclaimer, the term of this patent is extended or adjusted under 35 U.S.C. 154(b) by 58 days.

(21) Appl. No.: 12/485,937

(22) Filed: Jun. 17, 2009

(65) Prior Publication Data
US 2010/0321090 A1    Dec. 23, 2010

(51) Int. Cl.
*H05F 3/02* (2006.01)
(52) U.S. Cl. .................... 327/540; 327/544; 323/274
(58) Field of Classification Search .................. 327/540, 327/544; 323/270, 274
See application file for complete search history.

(56) References Cited

U.S. PATENT DOCUMENTS

| 5,629,609 | A | * | 5/1997 | Nguyen et al. | 323/269 |
| 5,847,551 | A | * | 12/1998 | Arora et al. | 323/224 |
| 6,285,230 | B1 | * | 9/2001 | Na | 327/277 |
| 6,552,596 | B2 | * | 4/2003 | Cowles et al. | 327/318 |
| 7,385,435 | B2 | * | 6/2008 | Pham et al. | 327/534 |
| 7,683,592 | B2 | * | 3/2010 | Soude et al. | 323/275 |
| 2003/0111985 | A1 | * | 6/2003 | Xi | 323/273 |

* cited by examiner

*Primary Examiner* — Kenneth B. Wells
(74) *Attorney, Agent, or Firm* — Prakash Nama; Global IP Services, PLLC

(57) ABSTRACT

A system and circuit for virtual power grid is disclosed. In one embodiment, a switch system for a virtual power grid includes a first transistor for connecting a power supply to a node of a virtual power grid for an isolated region of circuitry via the first transistor upon a receipt of a first control signal to turn on the first transistor. The switch system further includes a second transistor for connecting the power supply to the isolated region of circuitry via the second transistor upon a receipt of a second control signal to turn on the second transistor. In addition, the switch system includes a self-timed enable module for generating and forwarding the second control signal when a voltage level at the node of the virtual power grid which is charged by the power supply via the first transistor reaches a threshold voltage.

20 Claims, 4 Drawing Sheets

SYSTEM AND CIRCUIT FOR A VIRTUAL POWER GRID

FIELD OF TECHNOLOGY

Embodiments of the present invention relate to the field of electronics. More particularly, embodiments of the present invention relate to virtual power grid.

BACKGROUND

A region of circuitry may be isolated to save power. For example, a switch may be used to connect a power supply to the region when the region is used, but disconnects the region when it is not used. Thus, a virtual power grid may be formed at one end of the switch, whereas the power supply may interface at the other end of the switch. The virtual power grid may remove problems associated with leakage in various components of the region of circuitry as the power supply to the region is cut off when the region is not being used.

However, when the region is connected or reconnected to the power supply (e.g., the virtual power grid is turned on or formed), a rush current or huge amount of current may flow via the switch towards the region to fill capacitance of the region which has been drifted to ground. As a result, the rush current may cause a voltage drop in the power supply which is feeding the virtual power grid and, at the same time, which may be feeding other regions of circuitry. That is, the rush current can cause a voltage drop in the other regions of circuitry which may make them fail. Furthermore, the rush current may cause an electro-migration problem in the virtual power grid, where the large current can eat away electrons in the virtual power grid, thus causing a breakage.

SUMMARY

A system and circuit for a virtual power grid are disclosed. In one aspect, a switch system for a virtual power grid includes a first transistor for connecting a power supply to a node of a virtual power grid for an isolated region of circuitry via the first transistor upon a receipt of a first control signal to turn on the first transistor. The system also includes a second transistor for connecting the power supply to the isolated region of circuitry via the second transistor upon a receipt of a second control signal to turn on the second transistor.

The system further includes a self-timed enable module for generating and forwarding the second control signal when a voltage level at the node of the virtual power grid which is charged by the power supply via the first transistor reaches a threshold voltage. In the above switch system, an amount of a first current via the first transistor is less than an amount of a second current via the second transistor. Also, respective dimensions of the first transistor and the second transistor are configured to prevent each one of the first current and the second current from becoming a rush current.

In another aspect, a switch circuit for a virtual power grid includes a first PMOS coupled between a positive power supply ($V_{DD}$) and a node of the virtual power grid, and a second PMOS coupled between the $V_{DD}$ and the node of the virtual power grid, where a gate node of the first PMOS is operable to receive a first control signal and where a gate node of the second PMOS is operable to receive a second control signal. The switch circuit also includes an inverter including a third PMOS and a first NMOS, where a source node of the third PMOS is coupled to the $V_{DD}$ and a source node of the first NMOS is coupled to a ground, and where an input node and an output node of the inverter are coupled to the virtual power grid and to the gate node of the second PMOS, respectively.

Further, the switch circuit includes a fourth PMOS with a source node of the fourth PMOS coupled to the $V_{DD}$ and a drain node of the fourth PMOS coupled to the output node of the inverter where a gate node of the fourth PMOS is operable to receive an inverse of the first control signal. Moreover, the switch circuit includes a second NMOS with a drain node of the second NMOS coupled to the output node of the inverter and a source node of the second NMOS coupled to the drain node of the first NMOS, where a gate node of the second NMOS is operable to receive an inverse of the first control signal.

In yet another aspect, a semiconductor device includes a switch system. The switch system includes a first transistor for connecting a power supply to a node of a virtual power grid for an isolated region of circuitry via the first transistor upon a receipt of a first control signal to turn on the first transistor. The system also includes a second transistor for connecting the power supply to the isolated region of circuitry via the second transistor upon a receipt of a second control signal to turn on the second transistor.

The system further includes a self-timed enable module for generating and forwarding the second control signal when a voltage level at the node of the virtual power grid which is charged by the power supply via the first transistor reaches a threshold voltage. Further, in the above switch system, an amount of a first current via the first transistor is less than an amount of a second current via the second transistor. Also, respective dimensions of the first transistor and the second transistor are configured to prevent each one of the first current and the second current from becoming a rush current.

The methods, apparatuses and systems disclosed herein may be implemented in any means for achieving various aspects, and other features will be apparent from the accompanying drawings and from the detailed description that follow.

BRIEF DESCRIPTION OF THE DRAWINGS

Various preferred embodiments are described herein with reference to the drawings, wherein.

The drawings described herein are for illustration purposes only and are not intended to limit the scope of the present disclosure in any way.

DETAILED DESCRIPTION

A system and circuit for a virtual power grid are disclosed. In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 1:
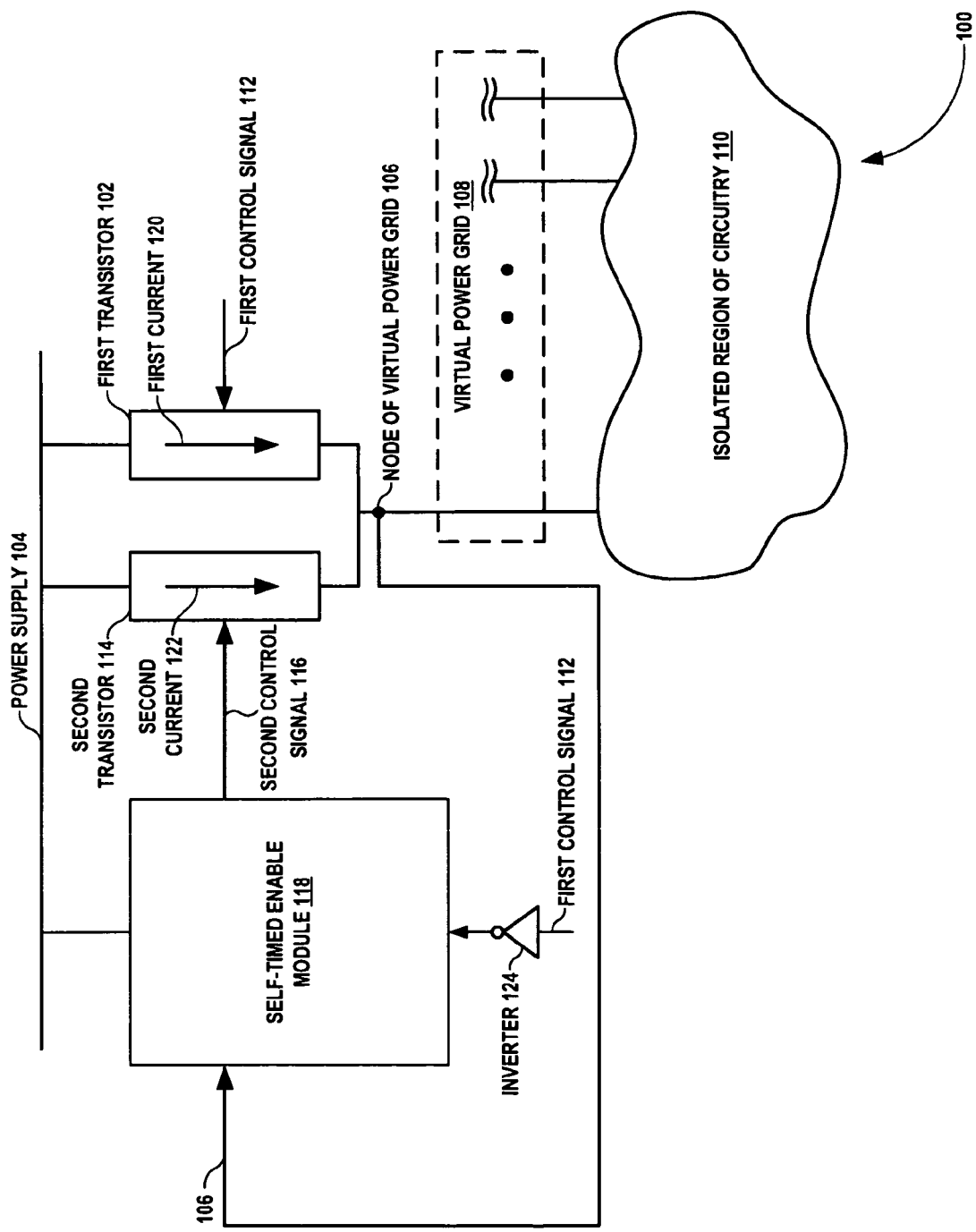
FIG. 1 illustrates an exemplary switch system for a virtual power grid, according to one embodiment.

FIG. 1 illustrates an exemplary switch system 100 for a virtual power grid 108, according to one embodiment. As illustrated, the switch system 100 is coupled to an isolated region of circuitry 110 through the virtual power grid 108. The switch system 100 includes a first transistor 102, a second transistor 114 and a self-timed enable module 118, which are coupled to a power supply 104.

In operation, the first transistor 102 is turned on upon a receipt of a first control signal 112. In one embodiment, the first control signal 112 may be a signal to initiate the activation of the virtual power grid 108. The first transistor 102 then connects the power supply 104 to a node of virtual power grid 106 to have a first current 120 flow via the first transistor 102. Accordingly, the power supply 104 charges the node of virtual power grid 106 via the first transistor 102 till a voltage level at the node of virtual power grid 106 reaches a threshold voltage. Further, the self-timed enable module 118 generates a second control signal 116 when the voltage level at the node of virtual power grid 106 reaches the threshold voltage. In one exemplary implementation, the self-timed enable module 118 generates the second control signal 116 based on the voltage level at the node of virtual power grid 106 and an inverse of the first control signal 112 (e.g., inputted through an inverter 124). Then, the self-timed enable module 118 forwards the second control signal 116 to the second transistor 114.

Further, the second transistor 114 is turned on upon a receipt of the second control signal 116. The second transistor 114 then connects the power supply 104 to the isolated region of circuitry 110 to have a second current 122 flow to the isolated region of circuitry 110. It can be noted that, an amount of the first current 120 via the first transistor 102 is less than an amount of the second current 122 via the second transistor 114. Also, in the above switch system 100, respective dimensions of the first transistor 102 and the second transistor 114 are configured to prevent each one of the first current 120 and the second current 122 from becoming a rush current.

Figure 2:
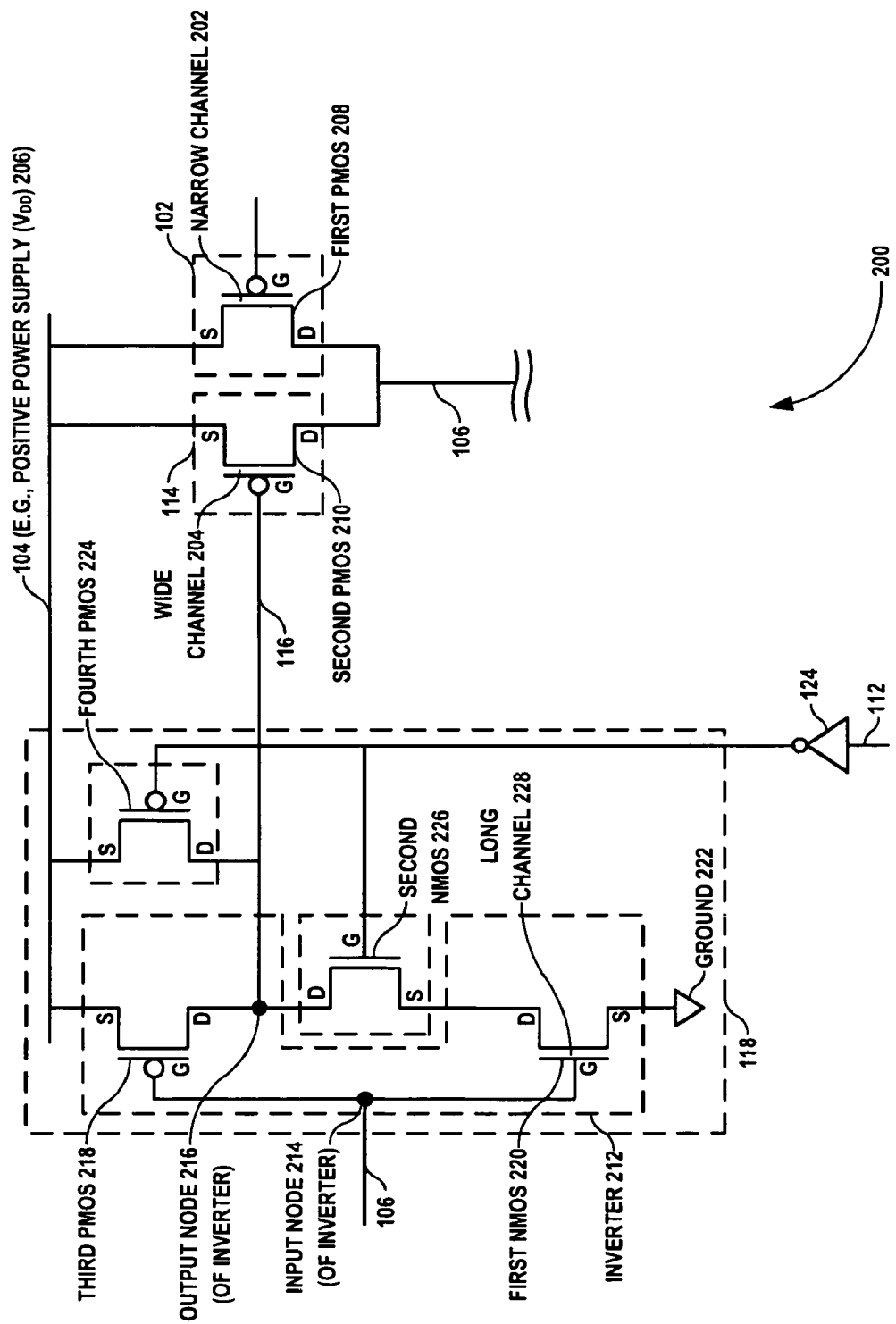
FIG. 2 illustrates the switch system of FIG. 1 with exemplary components, according to one embodiment.

FIG. 2 illustrates the switch system 100 of FIG. 1 with exemplary components, according to one embodiment. As illustrated, the first transistor 102 includes a first p-channel metal-oxide-semiconductor field-effect transistor (PMOS) 208 with a narrow channel 202. The second transistor 114 includes a second PMOS 210 with a wide channel 204. As shown in FIG. 2, a source node of the first PMOS 208 and a source node of the second PMOS 210 are coupled to a positive power supply ($V_{DD}$) 206. Further, a drain node of the first PMOS 208 and a drain node of the second PMOS 210 are coupled to the node of virtual power grid 106.

The self-timed enable module 118 includes an inverter 212, a fourth PMOS 224 and a second n-channel metal-oxide-semiconductor field-effect transistor (NMOS) 226. As illustrated, the inverter 212 includes an input node 214 and an output node 216. The input node 214 is connected to the node of virtual power grid 106. The output node 216 is connected to a gate node of the second PMOS 210.

Further, the inverter 212 includes a third PMOS 218 coupled to a first NMOS 220. As illustrated, a gate node of the third PMOS 218 and a gate node of the first NMOS 220 are coupled to the input node 214 of the inverter 212. A source node of the third PMOS 218 is coupled to the $V_{DD}$ 206 and a source node of the first NMOS 220 is coupled to a ground 222. A drain node of the third PMOS 218 is coupled to the output node 216 of the inverter 212. A drain node of the first NMOS 220 is coupled to a source node of the second NMOS 226.

A drain node of the second NMOS 226 and a drain node of the fourth PMOS 224 are coupled to the output node 216 of the inverter 212. A gate node of the second NMOS 226 and a gate node of the fourth PMOS 224 are coupled to the inverter 124 and are configured to receive the inverse of the first control signal 112. Further, a source node of the fourth PMOS 224 is coupled to the $V_{DD}$ 206.

In accordance with the above-described embodiments, a gate node of the first PMOS 208 is operable to receive the first control signal 112. In one exemplary implementation, the first PMOS 208 is turned on upon a receipt of the first control signal 112 and the $V_{DD}$ 206 is supplied to the node of virtual power grid 106 when the first control signal 112 is logical low. The node of virtual power grid 106 is charged due to the $V_{DD}$ 206 supplied by the first PMOS 208. Subsequently, a voltage level of the node of virtual power grid 106 may reach beyond a threshold voltage, where the voltage level greater than the threshold voltage may cause the voltage at the output node 216 of the inverter 212 to become logical low.

When the voltage level at the node of virtual power grid 106 reaches the threshold voltage, the third PMOS 218 is turned off and the first NMOS 220 is turned on. It can be noted that, the first NMOS 220 has a long channel 228. In one embodiment, the first NMOS 220 with the long channel 228 may provide large resistance when the inverter 212 is turned on. This prevents the inverter 212 from forming a short circuit between the VDD 206 and the ground 222. In another embodiment, a length of the long channel 228 can be configured for selecting a voltage level at the node of the virtual power grid 106. The selection of the voltage level at the node of virtual power grid 106 may help limit the amount of a rush current flowing via the node of virtual power grid 106 to a tolerable level.

Further, based on the voltage level, the self-timed enabled module 118 generates the second control signal 116. The second control signal 116 is then forwarded to a gate node of the second PMOS 210 coupled to the output node 216. In one example embodiment, the second PMOS 210 is turned on and the $V_{DD}$ 206 is supplied to the virtual power grid when the second control signal 116 is logical low.

Figure 3:
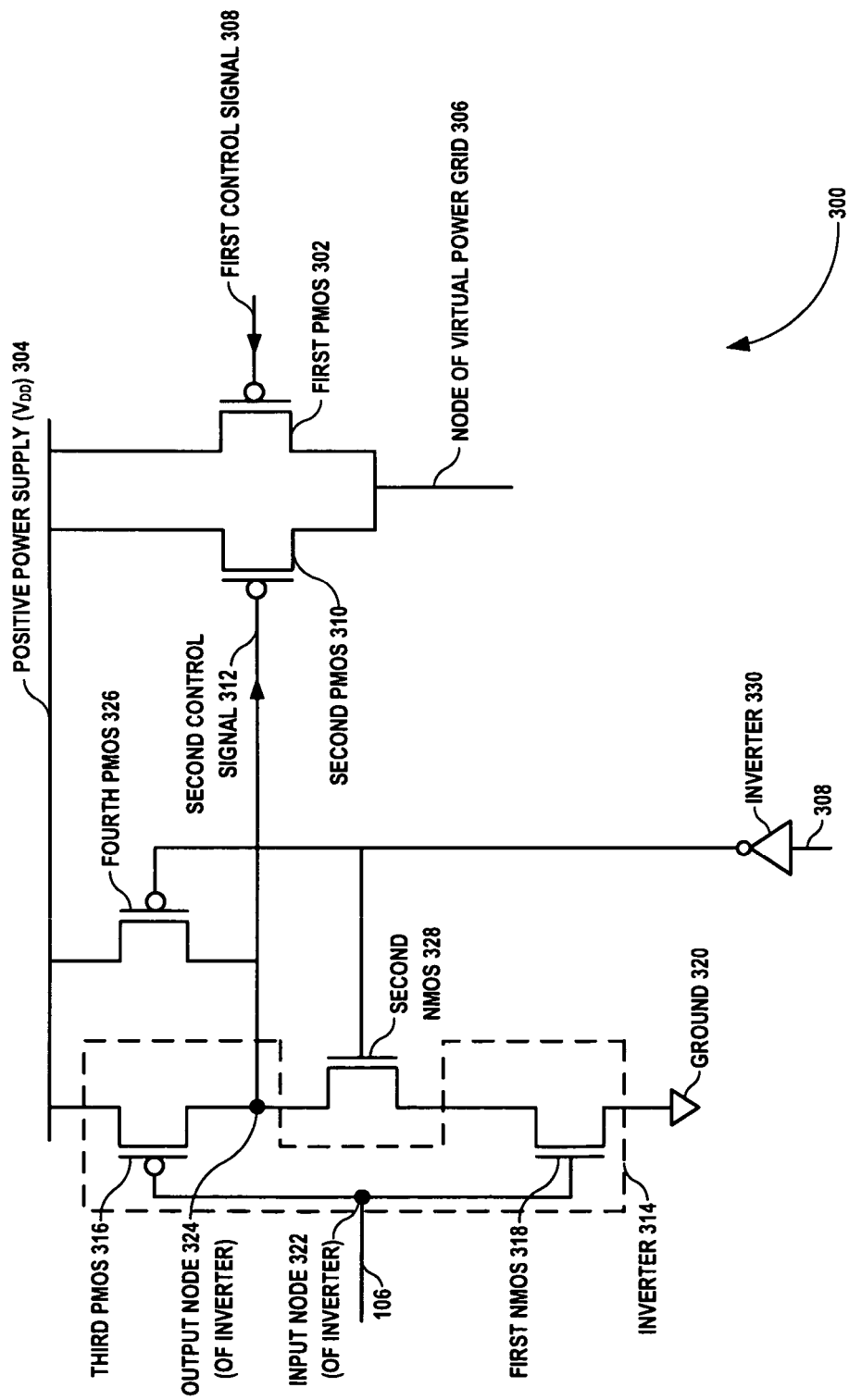
FIG. 3 illustrates an exemplary switch circuit for a virtual power grid, according to one embodiment.

FIG. 3 illustrates an exemplary switch circuit 300 for a virtual power grid, according to one embodiment. Particularly, the switch circuit 300 for the virtual power grid includes a first PMOS 302, a second PMOS 310, an inverter 314 including a third PMOS 316 and a first NMOS 318, a fourth PMOS 326, and a second NMOS 328. As illustrated, the first PMOS 302 is coupled between a positive power supply ($V_{DD}$) 304 and a node of virtual power grid 306. The second PMOS 310 is coupled between the $V_{DD}$ 304 and the node of the virtual power grid 306. In one embodiment, a width of the first PMOS 302 is less than a width of the second PMOS 310. In this embodiment, the width of the first PMOS 302 and the width of the second PMOS 310 are configured to prevent each of a first current and a second current from becoming a rush current.

As shown in FIG. 3, a source node of the third PMOS 316 is coupled to the $V_{DD}$ 304 and a source node of the first NMOS 318 is coupled to a ground 320. Further, an input node 322 of the inverter 314 is coupled to the node of virtual power grid 306. An output node 324 of the inverter 314 is coupled to a gate node of the second PMOS 310. A source node of the fourth PMOS 326 is coupled to the $V_{DD}$ 304. A drain node of the fourth PMOS 326 and a drain node of the second NMOS 328 are coupled to the output node 324 of the inverter 314. A source node of the second NMOS 328 is coupled to a drain node of the first NMOS 318. A gate node of the fourth PMOS 326 and a gate node of the second NMOS 328 are coupled to an inverter 330.

In operation, a gate node of the first PMOS 302 is operable to receive a first control signal 308. When the gate node of the first PMOS 302 is supplied with a first control signal 308 at logical low, the first PMOS 302 is turned on. Thus, the first PMOS 302 supplies the $V_{DD}$ 304 to the node of virtual power grid 306 to charge the node of virtual power grid 306. In one embodiment, the node of virtual power grid 306 is charged such that a voltage level at the node of virtual power grid 306 reaches a threshold voltage.

When the voltage level becomes greater than the threshold voltage, the third PMOS 316 is turned off and the first NMOS 318 is turned on. Also, the gate node of the fourth PMOS 326 and the gate node of the second NMOS 328 are supplied with an inverse of the first control signal 308 (e.g., logical high) via the inverter 330. Based on this, a second control signal 312 at logical low is generated at the output node 324 of the inverter 314. It is understood that a second control signal 312 at logical high is generated when a voltage level at the node of virtual power grid 306 is less than the threshold voltage. In one exemplary implementation, the first NMOS 318 includes a long channel to generate a sizable resistance via the first NMOS 318. This helps prevent a short circuit forming between the VDD 304 and the ground 320 when the inverter 314 is turned on.

Further, the gate node of the second PMOS 310 is supplied with the second control signal 312 which is logical low when the voltage level at the node of virtual power grid 306 is greater than the threshold voltage. Thus, upon receipt of the second control signal 312, the second PMOS 310 is turned on and the second PMOS 310 supplies the $V_{DD}$ 304 to the node of virtual power grid 306.

Figure 4:
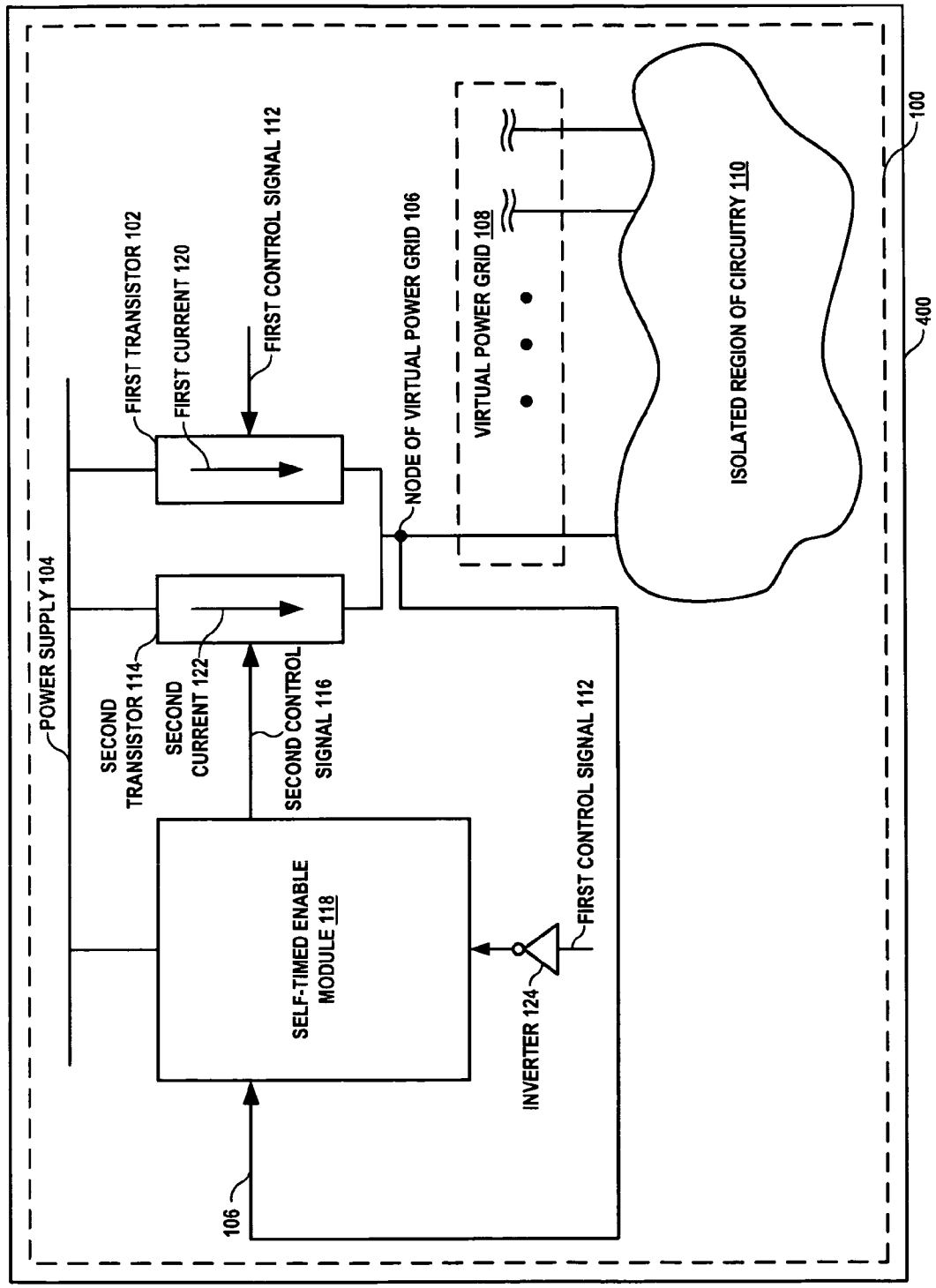
FIG. 4 illustrates an exemplary semiconductor device having the switch system of FIG. 1, according to one embodiment.

FIG. 4 illustrates an exemplary semiconductor device 400 having the switch system 100 of FIG. 1, according to one embodiment. The semiconductor device 400 with the switch system 100 may be a system-on-chip (SoC), custom-specific integrated circuits (ICs), and the like. The switch system 100 of the semiconductor device 400 includes the first transistor 102 for connecting the power supply 104 to the node of virtual power grid 106 for the isolated region of circuitry 110 based on the first control signal 112. Further, the switch system 100 includes the second transistor 114 for connecting the power supply 104 to the isolated region of circuitry 110 based on the second control signal 116. In addition, the switch system 100 includes the self-timed enable module 118 for generating and forwarding the second control signal when a voltage level at the node of virtual power grid 106 reaches a threshold voltage.

According to an embodiment of the present invention, the switch system 100 of the semiconductor device 400 may be communicatively coupled to other components of the semiconductor device 400. It is contemplated, of course, that any type of semiconductor devices may also benefit from the present invention, particularly, those having a virtual power grid. Accordingly, those of ordinary skill in art should realize upon reference hereto that the present invention may preferably be embodied in any suitable IP form.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., complementary metal-oxide-semiconductor (CMOS) based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated circuit (ASIC)).

What is claimed is:

1. A switch system for a virtual power grid, comprising:
    a first transistor for connecting a power supply to a node of a virtual power grid for an isolated region of circuitry via the first transistor upon a receipt of a first control signal to turn on the first transistor;
    a second transistor for connecting the power supply to the isolated region of circuitry via the second transistor upon a receipt of a second control signal to turn on the second transistor; and
    a self-timed enable module for generating and forwarding the second control signal when a voltage level at the node of the virtual power grid which is charged by the power supply via the first transistor reaches a threshold voltage, wherein the self-timed enable module generates the second control signal based on the voltage level at the node of virtual power grid and an inverse of the first control signal, wherein an amount of a first current via the first transistor is less than an amount of a second current via the second transistor, and wherein respective dimensions of the first transistor and the second transistor are configured to prevent each one of the first current and the second current from becoming a rush current.

2. The system of claim 1, wherein dimensions of the first transistor and the second transistor are configured to have the first transistor with a narrow channel and the second transistor with a wide channel.

3. The system of claim 1, wherein the power supply comprises a positive power supply ($V_{DD}$).

4. The system of claim 3, wherein the first transistor comprises a first p-channel metal-oxide-semiconductor field-effect transistor (PMOSFET).

5. The system of claim 4, wherein the receipt of the first control signal is performed via a gate node of the first PMOSFET, and wherein the turn on of the first PMOSFET is performed when the first control signal is logical low.

6. The system of claim 5, wherein the second transistor comprises a second p-channel metal-oxide-semiconductor field-effect transistor (PMOSFET).

7. The system of claim 6, wherein the receipt of the second control signal is performed via a gate node of the second PMOSFET, and wherein the turn on of the second PMOSFET is performed when the second control signal is logical low.

8. The system of claim 7, wherein the self-timed enable module comprises an inverter with an input node of the inverter connected to the virtual power grid and an output node of the inverter connected to the gate node of the second PMOSFET.

9. The system of claim 8, wherein the inverter comprises a third PMOSFET coupled to a first n-channel metal-oxide-semiconductor field-effect transistor (NMOSFET) with a source node of the third PMOSFET coupled to the $V_{DD}$ and a source node of the first NMOSFET coupled to a ground.

10. The system of claim 9, wherein the self-timed enable module further comprises a fourth PMOSFET with a source node of the fourth PMOSFET connected to the $V_{DD}$ and a drain node of the fourth PMOSFET connected to the output node of the inverter.

11. The system of claim 10, wherein the self-timed enable module further comprises a second NMOSFET with a drain node of the second NMOSFET connected to the output node of the inverter and a source node of the second NMOSFET connected to a drain node of the first NMOSFET.

12. The system of claim 11, wherein a gate node of the fourth PMOSFET and a gate node of the second NMOSFET are connected to an inverse of the first control signal such that the inverter is enabled when the first control signal is logical low.

13. The system of claim 12, wherein the first NMOSFET comprises an NMOSFET with a long channel for providing a large resistance to prevent the inverter from forming a short circuit between the $V_{DD}$ and the ground when the inverter is turned on.

14. The system of claim 13, wherein a length of the long channel is configured to select the voltage level of the virtual power grid.

15. A switch circuit for a virtual power grid, comprising:
   a first PMOSFET coupled between a positive power supply ($V_{DD}$) and a node of the virtual power grid, wherein a gate node of the first PMOSFET is operable to receive a first control signal;
   a second PMOSFET coupled between the $V_{DD}$ and the node of the virtual power grid, wherein a gate node of the second PMOSFET is operable to receive a second control signal;
   an inverter comprising a third PMOSFET and a first NMOSFET, wherein a source node of the third PMOSFET is coupled to the $V_{DD}$ and a source node of the first NMOSFET is coupled to a ground, and wherein an input node and an output node of the inverter are coupled to the virtual power grid and to the gate node of the second PMOSFET, respectively;
   a fourth PMOSFET with a source node of the fourth PMOSFET coupled to the $V_{DD}$ and a drain node of the fourth PMOSFET coupled to the output node of the inverter; and
   a second NMOSFET with a drain node of the second NMOSFET coupled to the output node of the inverter and a source node of the second NMOSFET coupled to the drain node of the first NMOSFET, wherein a gate node of the fourth PMOSFET and a gate node of the second NMOSFET are operable to receive an inverse of the first control signal.

16. The circuit of claim 15, wherein the first PMOSFET is turned on when the gate node of the first PMOSFET is supplied with the first control signal at logical low, and wherein the second PMOSFET is turned on when the gate node of the second PMOSFET is supplied with the second control signal at logical low.

17. The circuit of claim 15, wherein the second control signal at logical low is generated when a voltage level of the virtual power grid is greater than a threshold voltage to turn off the third PMOSFET and to turn on the first NMOSFET.

18. The circuit of claim 15, wherein a width of the first PMOSFET is less than a width of the second PMOSFET, and wherein the width of the first PMOSFET and the width of the second PMOSFET are configured to prevent each of a first current via the first PMOSFET and a second current via the second PMOSFET from becoming a rush current.

19. The circuit of claim 15, wherein the first NMOSFET comprises a long channel to generate a resistance via the first NMOSFET to prevent formation of a short circuit between the $V_{DD}$ and the ground when the inverter is turned on.

20. A semiconductor device, comprising:
   a switch system for a virtual power grid, comprising:
      a first transistor for connecting a power supply to a node of a virtual power grid for an isolated region of circuitry via the first transistor upon a receipt of a first control signal to turn on the first transistor;
      a second transistor for connecting the power supply to the isolated region of circuitry via the second transistor upon a receipt of a second control signal to turn on the second transistor; and
      a self-timed enable module for generating and forwarding the second control signal when a voltage level at the node of the virtual power grid which is charged by the power supply via the first transistor reaches a threshold voltage, wherein the self-timed enable module generates the second control signal based on the voltage level at the node of virtual power grid and an inverse of the first control signal, wherein an amount of a first current via the first transistor is less than an amount of a second current via the second transistor, and wherein respective dimensions of the first transistor and the second transistor are configured to prevent each one of the first current and the second current from becoming a rush current.

* * * * *